United States Patent [19]

MacDougall et al.

[11] Patent Number: 5,559,404
[45] Date of Patent: Sep. 24, 1996

[54] CAPACITIVE PULSE FORMING NETWORK

[75] Inventors: Frederick W. MacDougall; Xiao H. Yang, both of Marion, Mass.

[73] Assignee: Aerovox Incorporated, New Bedford, Mass.

[21] Appl. No.: 493,161

[22] Filed: Jun. 21, 1995

[51] Int. Cl.$^6$ .................................................. H05B 37/02
[52] U.S. Cl. ............................ 315/209 CD; 315/209 SC; 315/209 M
[58] Field of Search ........................ 315/209 CD, 209 T, 315/209 SC, 209 M, 209 R

[56] References Cited

U.S. PATENT DOCUMENTS

| | | | |
|---|---|---|---|
| 4,296,358 | 10/1981 | Bernier | 315/209 CD |
| 4,381,476 | 4/1983 | Adachi et al. | 315/101 |
| 4,558,404 | 12/1985 | James | 315/209 CD |

OTHER PUBLICATIONS

D. Bhasavanich et al., "4.5 Modular Pulse Power Supply for ET Gun Applications", Ninth IEEE International Pulsed Power Concurrence, Albuquerque, NM, 1993, pp. 772–775.

P. Yu. Emelin et al., "Programmed Discharge of the Capacity Energy Storage", Ninth IEEE International Pulsed Power Concurrence, Albuquerque, NM, 1993, pp. 568–574.

P. Yu. Emelin et al., "Capacity Energy Storage Unit of E7–25 Type", Ninth IEEE International Pulsed Power Concurrence, Albuquerque, NM, 1993, pp. 575–578.

D. F. Strachan et al., "Design and Performance of a Transportable 1 MJ Pulsed Power Source for Electric Power Source for Electric Gun Investigations", Ninth IEEE International Pulsed Power Concurrence, Albuquerque, NM, 1993, pp. 780–782.

*Primary Examiner*—Frank Gonzalez
*Assistant Examiner*—Reginald A. Ratliff
*Attorney, Agent, or Firm*—Fish & Richardson P.C.

[57] ABSTRACT

The invention features a capacitive pulse forming network including at least one capacitor having a substantially linear discharge characteristic and at least another capacitor having a nonlinear discharge characteristic. The capacitive pulse forming network allows the duration and shape of pulses generated by the network to be accurately controlled.

13 Claims, 5 Drawing Sheets

CAPACITIVE PULSE FORMING NETWORK

BACKGROUND OF THE INVENTION

The invention relates to high energy pulse-forming networks.

In certain applications where high power sources (e.g., power lines, batteries) are unable to deliver high levels of peak power, pulse forming networks having high-energy density capacitors are often used. In these applications, the capacitors are slowly charged from the power source and then quickly discharged for short time periods to provide pulsed energy at high peak power levels. The capacitors are typically used with large inductors to store energy from the external power source and to establish the frequency of the period and shape of the output pulse from the network.

Large high power inductors are often used with capacitors to shape the arc passing through the plasma. One technique for controlling the pulse shape of the arc is called the "multiple trigger" or "programmed discharge" approach. In this approach, a pulse forming network includes a number of capacitors each having an associated switch that is sequentially triggered to discharge its capacitor at a predesignated time. Each capacitor and associated switch generally requires an isolating diode to prevent feedback between the capacitors. Because the isolating diodes must be capable of handling the large values of peak power they are relatively large and expensive.

SUMMARY OF THE INVENTION

The invention features an approach for controlling the shape and duration of pulses generated by a capacitive pulse forming network. The pulse forming network includes capacitors connected to an external load, at least one of the capacitors having a substantially linear discharge characteristic and at least another having a nonlinear discharge characteristic.

The linearity characteristics of the capacitors are selected and combined to shape the pulse and control its duration for a given application. As a result, a relatively simple and physically small circuit provides pulse shape control without the use of high power inductors that are relatively large and heavy.

In preferred embodiments, the nonlinear discharge capacitor includes a polyvinylidene fluoride dielectric layer. The capacitors may be connected to each other in parallel or series to provide storage sections capable of generating high energy pulses greater than several hundred joules. These storage sections may be, in turn, combined to provide even higher energy capacitor banks capable of generating energy pulses greater than 1 megajoule. The discharge element may be a high coulomb spark gap switch which is in the open state during the charging period and in the closed state during the discharge period.

In another embodiment, the linear and nonlinear discharge capacitors may be used as part of a programmable discharge circuit with each capacitor having an associated switch. The switches are triggered sequentially to discharge the capacitors and provide the desired pulse shape. Each capacitor may be connected to an impedance network having an inductor and/or a resistor for providing additional pulse shaping.

The linear and nonlinear capacitors may be fabricated independently in a single or separate canister housings. Alternatively, the capacitors may be fabricated in a single winding as an integral capacitor unit having conductive electrodes separated by at least a pair of dielectric sheets with at least one of the dielectric sheets having polyvinylidene fluoride. In another embodiment, the pair of dielectric sheets may include differing amounts of polyvinylidene fluoride.

DESCRIPTION OF THE PREFERRED EMBODIMENTS

Figure 1:
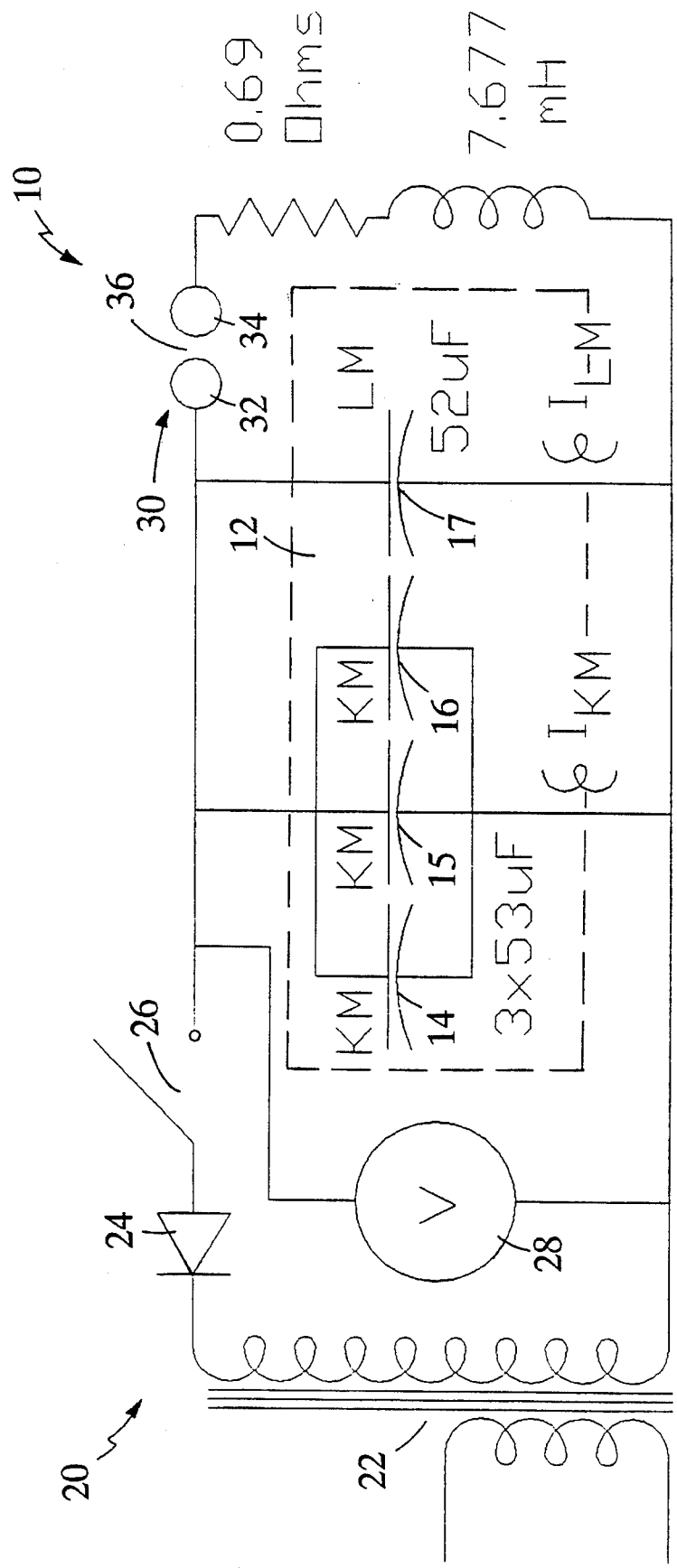
FIG. 1 is a schematic representation of a pulse forming discharge test circuit.

Referring to FIG. 1, a pulse forming network 10 includes a capacitor bank 12 having three linear discharge capacitors 14–16 and a nonlinear discharge capacitor 17 all connected in parallel to each other. Each of the capacitors is charged from a DC voltage level charging power supply 20 having a transformer 22 (which steps up a low AC voltage signal from an external source to a higher AC voltage) and a rectifier diode 24 (for converting the AC from the transformer to DC). A charging switch 26 is initially placed in its closed position to allow the DC signal from power supply 20 to charge capacitors 14–17. A voltmeter 28 is used to monitor the voltage across the capacitors and upon reaching a desired voltage level, it is removed and switch 26 is opened to protect power supply 20 during discharge of capacitors 14–17. The time required to charge the capacitors may be as long as several minutes. The pulse forming network also includes a high coulomb spark gap switch 30, (e.g., Model T150, Physics International Company, San Leandro, Calif.) having a pair of terminals 32, 34, separated by a gap 36 which upon triggering causes an arc to be generated to allow capacitors 14–17 to discharge into a load 38.

Capacitance may be defined by the relationship:

$$C = dq/dV.$$

where: C=capacitance in farads (coulombs/volt)

q=stored charge in the capacitor in coulombs

V=potential across the capacitor in volts

Linear discharge capacitors 14–16 have a characteristic where a change in charge (or discharge) provides a linear change in voltage. It is appreciated that "linear" discharge capacitors 14–16 includes those capacitors that may not be perfectly linear, but are highly linear relative to the nonlinear discharge characteristic of capacitor 17. Linear discharge capacitors 14–16 are high energy density metal film capacitors (e.g, Product No. KM532YWO53D, Aerovox Corporation, New Bedford, Mass.) each having an energy content of 0.754 KJ and a capacitance of 53 µF. On the other hand, nonlinear discharge capacitor 17 has a characteristic in which the charge and voltage have a nonlinear relationship. At a certain charge level, the rate of voltage change with respect to increasing charge decreases across the nonlinear capacitor and the capacitor loses its linear characteristic. Nonlinear discharge capacitor 17 is also a high energy density metal film capacitor (e.g., Product No. LM532YWO50D, Aerovox Corporation, New Bedford, Mass.) having an energy content of 0.740 KJ and a capacitance of 52 μfarads. Both linear and nonlinear discharge capacitors 14–17 are electrostatic, as opposed to electrolytic, and are fabricated as two separate solid foil electrodes wound around two separate dielectrics in a convoluted manner. The solid foil electrodes are fabricated from sheets of aluminum having a thickness of 0.22 mil with a metallized layer of 300 angstroms of zinc. Linear discharge capacitors 14–16 include as part of the dielectric system separating the electrodes a combination of linear dielectrics, for example, polypropylene and kraft tissue, while nonlinear discharge capacitor 17 include a layer of nonlinear dielectric, such as polyvinylidene fluoride (PVDF). Both linear and nonlinear discharge capacitors 14–17 are impregnated with a dielectric fluid, for example, castor oil. It is believed that the long chain molecular structure of PVDF provides the nonlinear charge/discharge characteristic of capacitor 17. One explanation is that as the nonlinear discharge capacitor begins to absorb charges within the PVDF layer, the long chain molecules begin to twist to align the charges. This twisting action results in the stored charge in the PVDF to be released at a nonlinear rate.

Figure 2:
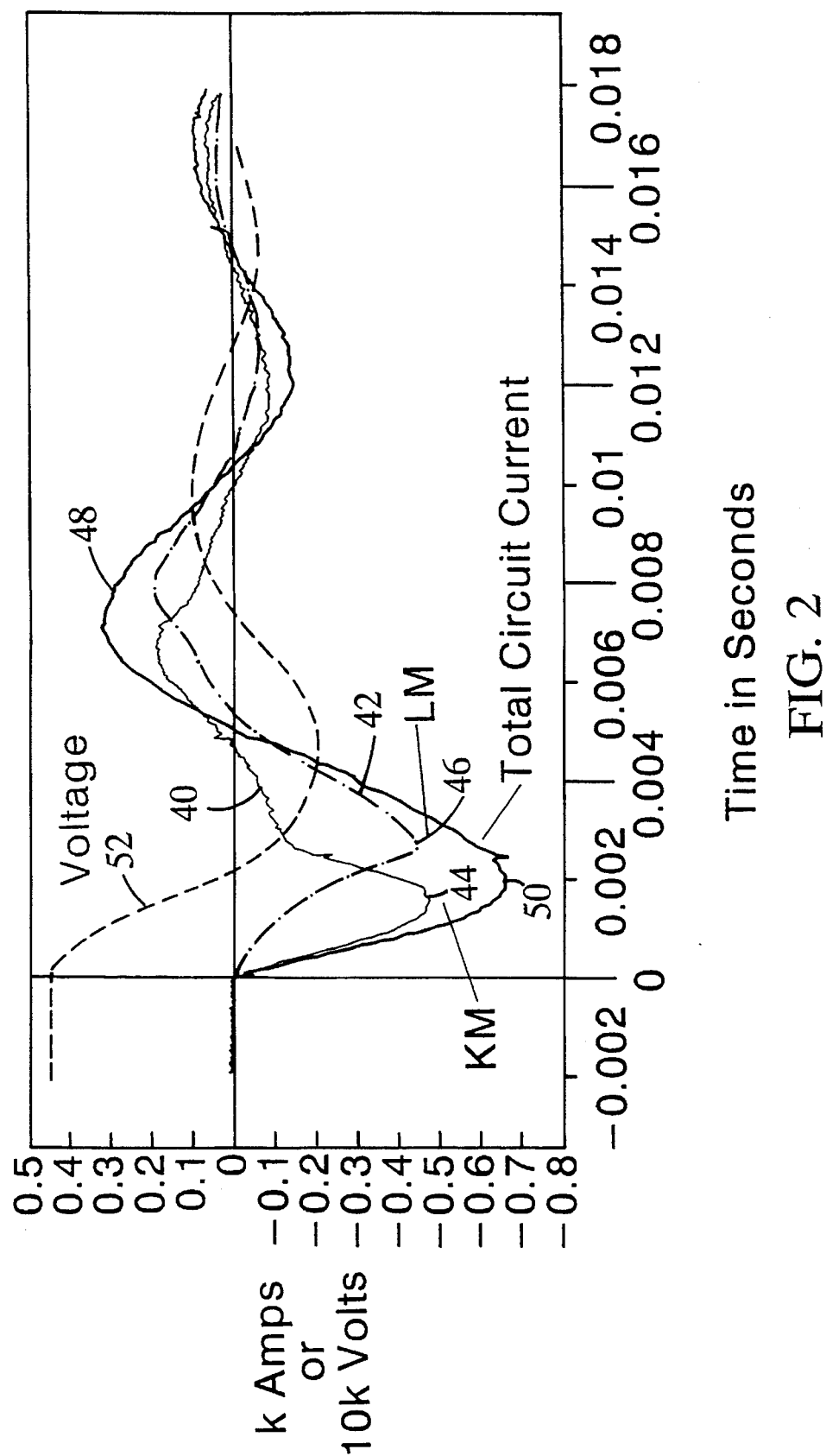
FIG. 2 is a typical plot showing the current level waveforms through the linear discharge capacitors and a nonlinear discharge capacitor individually, the resultant current waveform of the capacitors, and the voltage across the capacitors.

Referring to FIG. 2, the resultant output waveform from pulse circuit 10 is shown. In particular, curves 40, 42 represent typical output current characteristics (Y-axis) in units of kiloamps as a function of time in seconds (X-axis) for linear and nonlinear discharge capacitors 14–17, respectively. Note that at t=0, when the capacitors are discharged, curve 40 decreases rather sharply from a value of 0 kiloamps to a peak 44 at –0.46 kiloamps before rising and settling into a damped sinusoidal pattern. Curve 42, on the other hand, discharges at a much slower rate so that the current reaches a peak 46 about one microsecond after peak 44 of the linear discharge capacitor before it too settles into a damped sinusoidal waveform. The total output current curve 48 (the superposition of curves 40, 42) of the capacitors is shown having a peak 50 between component peaks 44 and 46. It has been observed that connecting nonlinear discharge capacitor 17 in parallel with the linear discharge capacitors 14–16 causes current peak 44 to occur slightly earlier than if measured without capacitor 17. Curve 52 represents the voltage (Y-axis) in units of 10,000 volts across the capacitors. Although a single nonlinear discharge capacitor may be used to provide longer duration pulses than linear discharge capacitors, by adjusting the values of capacitors 14–16 and 17, the shape of the total output current pulse can be "tuned" to have a duration between that of the combination of linear discharge capacitors 14–16 and nonlinear discharge capacitor 17.

Figure 3:
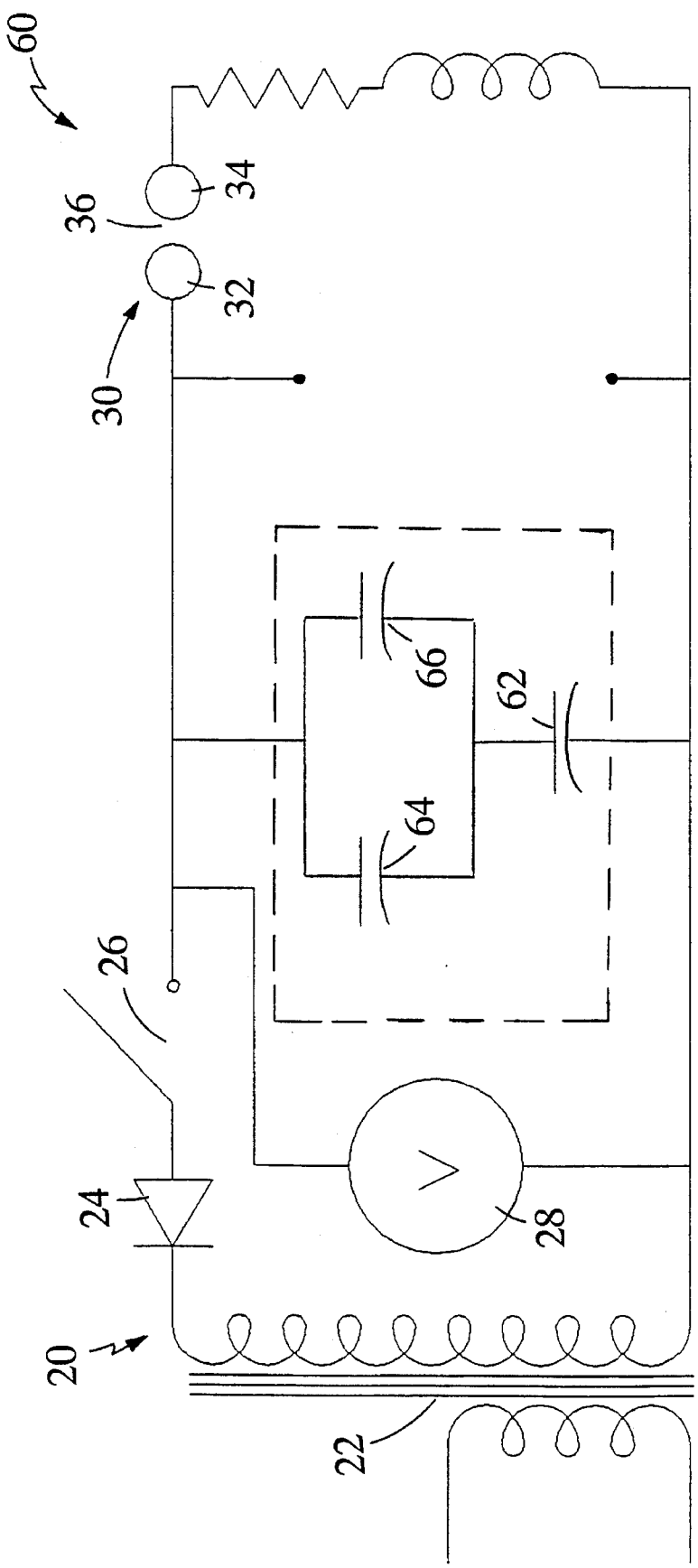
FIG. 3 is a schematic representation of another embodiment of a pulse forming network.

Pulse circuit 10 may be configured in other topologies. For example, referring to FIG. 3, a pulse forming circuit 60 includes a nonlinear discharge capacitor 62 arranged in series with a pair of parallel connected linear discharge capacitors 64, 66 so that the current through the capacitors are the same but the voltage across the capacitors varies. In this configuration, the voltage waveform rather than the current waveform 50 of FIG. 2 is shaped.

Figure 4:
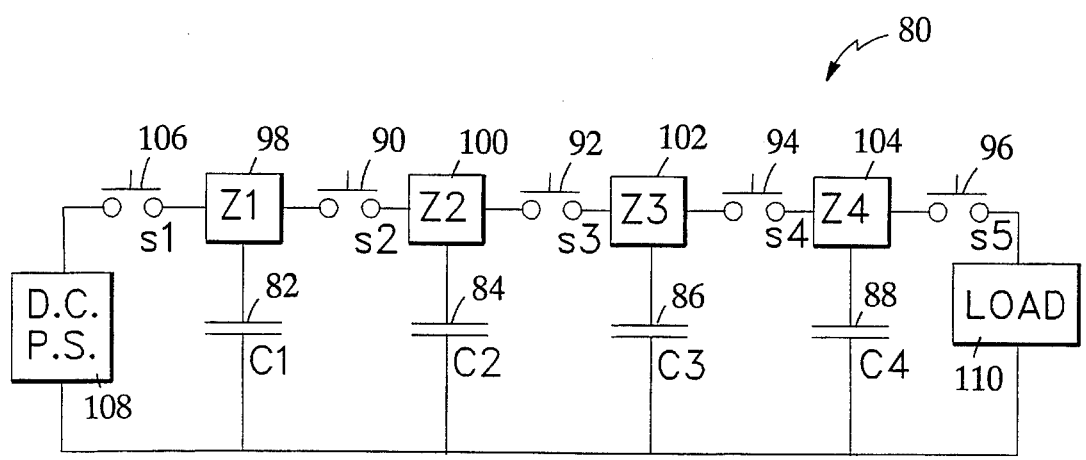
FIG. 4 is a schematic representation of still another embodiment of a pulse forming network.

Referring to FIG. 4, the invention is shown used in conjunction with a programmed discharge circuit 80 to provide additional flexibility and control in shaping the pulse output. Discharge circuit 80 includes capacitors 82–88 each having a switch 90–96 and inductor 98–104 (represented as impedances $Z_1$–$Z_4$, respectively). Capacitors 82–88 may be any combination of linear discharge and nonlinear discharge capacitors. A switch 106 is used to connect DC charging power supply 108 to the capacitors. In operation, switches 90–94 and 106 are all closed until capacitors 82–88 are fully charged at which time the switches are opened. During discharge, switch 96 is closed to allow capacitor 88 to discharge into a common load 110. Switches 94, 92, and 90 are then closed in succession to provide the proper pulse shape characteristics.

Figure 5:
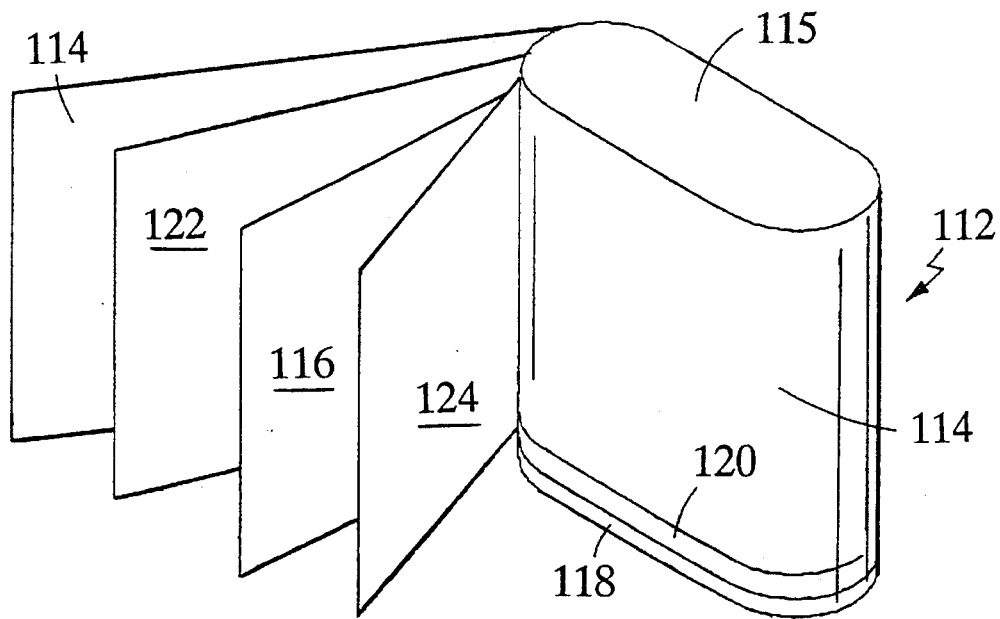
FIG. 5 is a perspective view of a wound capacitor (removed from its housing and partially unwrapped).
Figure 6:
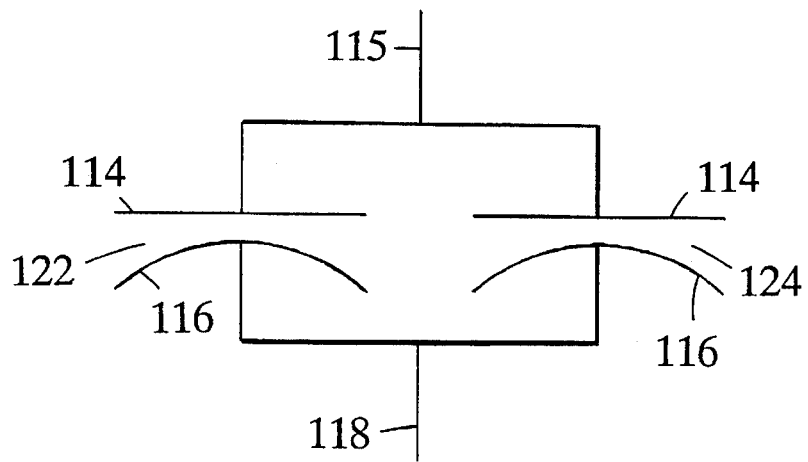
FIG. 6 is a schematic representation of the wound capacitor of FIG. 5.

The individual linear and nonlinear capacitors may be wound independently and disposed in separate canisters or within a single canister. Alternatively, both a linear and a nonlinear discharge capacitor may be fabricated as a single wound unit within a housing. Referring to FIG. 5, wound capacitor 112 includes a first aluminum foil electrode 114 connected to a top portion 115 of housing. A second aluminum foil electrode 116 is likewise connected to a bottom portion 118 of housing, with a dielectric spacer 120 used to isolate the top and bottom portions. Sandwiched between electrodes 114, 116 are a pair of dielectric layers 122, 124. In this embodiment, dielectric layer 122 is formed of polypropylene and kraft tissue while portion 124 is formed of PVDF as described above. Thus, as shown schematically in FIG. 6, a linear discharge capacitor is formed by electrodes 114, 116, separated by dielectric layer 122, while a nonlinear discharge capacitor is formed by the same electrodes 114, 116 separated by dielectric layer 124. In other embodiments, dielectric layer 122 may include a relatively small amount of PVDF combined with the polypropylene and kraft tissue to provide a capacitor having a nonlinear characteristic much less than non linear characteristic of the capacitor having dielectric layer 124. The nonlinearity characteristic is generally proportional to the amount of PVDF in the particular layer. Other approaches for winding combinations of capacitors within a single unit are described in U.S. Pat. No. 4,856,112, assigned to the assignee of the present invention, and hereby incorporated by reference.

Other embodiments are within the claims. For example, it is appreciated that any combination of series and parallel capacitors may be combined, either separately, within the same capacitor housing, or, in some cases, within the same winding (see FIG. 5) to provide the desired shape of voltage or current waveform. Furthermore, in applications where a spark gap switch 30 is used to discharge the capacitors, it may be any of a variety of high action spark gap switches including, as is well known in the art, a mid-plane switch.

What is claimed is:

1. A high energy pulse forming network for delivering high level energy pulses to an external load, comprising:

a plurality of interconnected capacitors, at least one of the capacitors comprises conductive electrodes separated by a linear dielectric sheet to provide a substantially linear discharge versus voltage characteristic for storing energy delivered from an electrical source and at least another of the plurality of capacitors comprises conductive electrodes separated by a nonlinear dielectric sheet to provide a nonlinear discharge versus voltage characteristic for storing energy delivered from said electrical source; and a discharge system, connected to the plurality of capacitors, for discharging the plurality of capacitors and delivering the stored energy to an external load.

2. The pulse forming network of claim 1 wherein the nonlinear dielectric sheet comprises polyvinylidene fluoride.

3. The pulse forming network of claim 1 wherein the interconnected capacitors are connected in parallel.

4. The pulse forming network of claim 1 wherein the at least one capacitor having a linear discharge versus voltage characteristic is connected in series to the at least another of the plurality of capacitors having a nonlinear discharge versus voltage characteristic.

5. The pulse forming network of claim 1 further comprising an external impedance network connected to the plurality of capacitors for providing pulse shaping.

6. The pulse forming network of claim 5 wherein the external impedance network comprises an inductor.

7. The pulse forming network of claim 6 wherein the discharge system comprises a spark gap switch.

8. The pulse forming network of claim 7 wherein the discharge system comprises spark gap switches associated with each of the plurality of interconnected capacitors for discharging the capacitors in a time sequential manner.

9. The pulse forming network of claim 1 wherein the plurality of capacitors are fabricated within a housing as an integral capacitor unit.

10. The pulse forming network of claim 9 wherein the plurality of capacitors are fabricated within the housing as an integral winding.

11. The pulse forming network of claim 10 wherein the integral winding comprises at least one dielectric sheet comprising polyvinylidene fluoride.

12. The pulse forming network of claim 11 wherein the integral winding comprises a pair of dielectric sheets separating the conductive electrodes each dielectric sheet comprising a different amount of polyvinylidene fluoride.

13. A method of generating high level energy pulses in a high energy pulse forming network, comprising the steps of:

connecting at least one substantially linear discharge capacitor comprising conductive electrodes separated by a linear dielectric sheet to provide a linear discharge versus voltage characteristic to an external load;

connecting at least one nonlinear discharge capacitor comprising conductive electrodes separated by a nonlinear dielectric sheet to provide a nonlinear discharge versus voltage characteristic to an external load;

connecting a discharge element between the external load and the linear and nonlinear discharge capacitors;

providing electrical energy to the linear and nonlinear discharge capacitors to charge and store energy within the capacitors; and applying an electrical signal to the discharge element to discharge the energy stored within the capacitors into the external load.

* * * * *